United States Patent
Reynolds et al.

(10) Patent No.: US 7,209,624 B2
(45) Date of Patent: Apr. 24, 2007

(54) APPARATUS AND METHOD FOR ILLUMINATION OF LIGHT VALVES

(75) Inventors: Meritt Reynolds, Burnaby (CA); Olena Dets, Burnaby (CA); Scott Shiue, Surrey (CA); Ichiro Shinkoda, Vancouver (CA); Ingo Speier, Vancouver (CA)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/038,188

(22) Filed: Jan. 21, 2005

(65) Prior Publication Data

US 2005/0175285 A1    Aug. 11, 2005

Related U.S. Application Data

(60) Provisional application No. 60/539,336, filed on Jan. 28, 2004.

(51) Int. Cl.
  G02B 6/00   (2006.01)
  G02B 6/10   (2006.01)
  F21S 10/00  (2006.01)
  G08B 5/00   (2006.01)

(52) U.S. Cl. ............... 385/133; 385/146; 385/147; 340/815.42; 116/202

(58) Field of Classification Search ......... 385/133, 385/146, 147, 33, 35; 362/551, 553, 555
See application file for complete search history.

(56) References Cited

U.S. PATENT DOCUMENTS

| 5,060,119 | A  |         | 10/1991 | Parthasarathy |
| 5,517,359 | A  |         | 5/1996  | Gelbart |
| 5,745,153 | A  |         | 4/1998  | Kessler et al. |
| 5,861,992 | A  |         | 1/1999  | Gelbart |
| 5,900,981 | A  |         | 5/1999  | Oren et al. |
| 5,902,033 | A  | *       | 5/1999  | Levis et al. ................. 353/122 |
| 5,923,475 | A  |         | 7/1999  | Kurtz et al. |
| 6,005,717 | A  |         | 12/1999 | Neuberger et al. |
| 6,064,528 | A  |         | 5/2000  | Simpson, Jr. |
| 6,137,631 | A  | *       | 10/2000 | Moulin ....................... 359/618 |
| 6,318,863 | B1 | *       | 11/2001 | Tiao et al. .................... 353/31 |
| 6,478,452 | B1 |         | 11/2002 | Richardson et al. |
| 6,494,371 | B1 |         | 12/2002 | Rekow et al. |
| 6,612,719 | B2 |         | 9/2003  | Richardson et al. |
| 6,795,243 | B1 | *       | 9/2004  | McGettigan et al. ........ 359/486 |
| 6,868,223 | B2 | *       | 3/2005  | Shinoda ...................... 385/146 |
| 6,916,097 | B2 | *       | 7/2005  | Omoda et al. ................. 353/31 |
| 6,939,009 | B2 | *       | 9/2005  | Fischer et al. ................ 353/43 |

(Continued)

FOREIGN PATENT DOCUMENTS

CA    2358169 A1    4/2003

OTHER PUBLICATIONS

International Search Report for PCT/CA2005/000101, International Searching Authority, Jun. 23, 2005, pp. 1-4.

*Primary Examiner*—Michelle Connelly-Cushwa
*Assistant Examiner*—Rhonda S. Peace
(74) *Attorney, Agent, or Firm*—Roland R. Schindler, II (57) ABSTRACT

In an illumination system the radiation from one or more laser arrays is directed into a light pipe. The light pipe mixes the individual radiation contributions from the laser arrays and forms a uniform illumination line. The pointing direction of each of the laser arrays is monitored and controlled to preserve the brightness of the composite illumination line.

5 Claims, 5 Drawing Sheets

U.S. PATENT DOCUMENTS

| | | | |
|---|---|---|---|
| 6,941,035 B2 * | 9/2005 | Laberge et al. | 385/17 |
| 6,950,454 B2 * | 9/2005 | Kruschwitz et al. | 372/92 |
| 2002/0196562 A1 | 12/2002 | Richardson et al. | |
| 2004/0207822 A1 * | 10/2004 | Lee et al. | 353/98 |
| 2004/0223227 A1 * | 11/2004 | Ohmori et al. | 359/619 |

* cited by examiner

APPARATUS AND METHOD FOR ILLUMINATION OF LIGHT VALVES

CROSS-REFERENCES TO RELATED APPLICATIONS

The following application for patent claims priority from U.S. Provisional Application Ser. No. 60/539,336, entitled "Line Illumination of Light Valves", filed Jan. 28, 2004.

STATEMENT REGARDING FEDERALLY SPONSORED R&D

Not applicable

REFERENCE TO MICROFICHE APPENDIX

Not applicable

TECHNICAL FIELD

The invention relates to the field of laser illumination and more particularly to producing illumination lines for use in imaging and other applications.

BACKGROUND

Diode lasers are used in many imaging applications as a convenient and low-cost radiation source. Material processing applications may make use of suitably coupled diode laser radiation to change the nature or character of a workpiece. Image recording and display systems may use laser diodes to provide illumination for an optical system.

In one particular imaging application, a monolithic array of laser diode emitters may be used to illuminate a multichannel light valve. A light valve generally has a plurality of individually addressable modulator sites; each site producing a beam or channel of imagewise modulated light. An image is formed by selectively activating the channels while scanning them over an image receiver. For high quality imaging it is usually necessary that channels be uniform in their imaging characteristics, a requirement that presents a difficult challenge for system designers since the illumination from a laser diode is highly astigmatic with poor overall beam quality. Consequently optical systems for gathering and formatting the light output seek to overcome the inherent limitations of the diode laser output in order to produce useable illumination.

U.S. Pat. No. 5,517,359 to Gelbart describes a method for imaging the radiation from a laser diode array having multiple emitters onto a linear light valve. The optical system superimposes the radiation line from each emitter at the plane of the light valve, thus forming a single combined illumination line. The superimposition provides some immunity from emitter failures (either partial of full). In the event of such a failure, while the output power is reduced, the uniformity of the line is not severely impacted.

Even with superimposed emitters, the uniformity of the individual emitter radiation profiles still has an impact on the overall uniformity of the line. A good laser diode array can have emitters that are more than 20% non-uniform in the slow axis. When the radiation from a plurality of emitters is combined, some of the non-uniformities may offset each other but commonly 10–15% non-uniformity remains. Some light valves can accommodate this non-uniformity by balancing the output from each channel by attenuating output from channels that are more strongly illuminated. This however represents wastage of up to 15% of the useful light output since it is not possible to amplify weak channels.

U.S. Pat. No. 6,137,631 to Moulin describes a means for mixing the radiant energy from a plurality of emitters on a laser diode array. The mixing means comprises a plurality of reflecting surfaces placed at or downstream from a point where the laser radiation has been focused. The radiant energy entering the mixing means is subjected to multiple reflections, which makes the output distribution of the emerging radiant energy more uniform.

Laser diode arrays having nineteen or more 150 μm emitters are now available with total power output of around 50 W at a wavelength of 830 nm. While efforts are constantly underway to provide higher power, material and fabrication techniques still limit the power that can be achieved for any given configuration. In order to provide illumination lines with total power in the region of 100 W, an optical system designer may only be left with the option of combining the radiation from a plurality of laser diode arrays. Dual laser array combinations are disclosed in U.S. Pat. No. 5,900,981 to Oren et. al. and U.S. Pat. No. 6,064,528 to Simpson.

SUMMARY OF THE INVENTION

In a first aspect of the present invention a light valve illuminator comprises at least one laser array, each of the at least one laser array being operable for emitting a corresponding plurality of radiation beams, and a light pipe. The light pipe is defined by two reflecting surfaces which are spaced apart and oppose one another. The light pipe has an input end and an output end. The input end is operable to receive the corresponding plurality of radiation beams from each the at least one laser array. Portions of any given corresponding plurality of radiation beams do not overlap at the input end with other portions of the same corresponding plurality of radiation beams. Additionally, a portion of one corresponding plurality of radiation beams will not overlap at the input end with a portion of another corresponding plurality of radiation beams. In all cases, each respective portion of the corresponding plurality of laser beams is less than the total of the corresponding plurality of radiation beams. There is at least one optical element located downstream of the output end for imaging the light pipe output end onto the light valve.

In another aspect of the present invention a method for coupling a plurality of radiation beams from one or more laser arrays onto a light valve is provided. A corresponding plurality of radiation beams from each of the one or more laser arrays is emitted into a light pipe, the light pipe having an input end, an output end and a pair of spaced apart opposing reflecting surfaces therebetween. During the emitting, portions of any given corresponding plurality of radiation beams do not overlap at the input end with other portions of the same corresponding plurality of radiation beams. Further, a portion of one corresponding plurality of radiation beams does not overlap at the input end with a portion of another corresponding plurality of radiation beams. In all cases, each respective portion of the corresponding plurality of laser beams is less than the total of the corresponding plurality of radiation beams. The output end of the light pipe is imaged onto the light valve.

In yet another aspect of the invention an illumination system comprises at least two lasers, each laser capable of producing a radiation beam and a light pipe for combining the radiation beams from the lasers into a composite illumination line. A position sensor is located downstream of the light pipe for monitoring the position of the radiation beams and generating a position feedback signal, and there is at least one actuator for changing the pointing direction of at least one of the radiation beams in response to the position feedback signal.

For an understanding of the invention, reference will now be made by way of example to a following detailed description in conjunction by accompanying drawings.

BRIEF DESCRIPTION OF THE DRAWINGS

In drawings which illustrate by way of example only preferred embodiments of the invention:

FIG. 2-A is a plan view of the illumination system of FIG. 1;

FIG. 2-B is a side view of the illumination system of FIG. 1;

FIG. 5-A is a perspective view of a beam pointing control system;

FIG. 5-B is a schematic diagram of a beam pointing servo system;

FIG. 6-A is a plan view of a light pipe illumination system;

FIG. 6-B is a phase space plot of the output from the light pipe shown in FIG. 6-A;

FIG. 7-A is a perspective view of an alternative embodiment of a beam pointing control system; and FIG. 7-B is a plan view of the detector shown in FIG. 7-A.

DESCRIPTION

Figure 1:
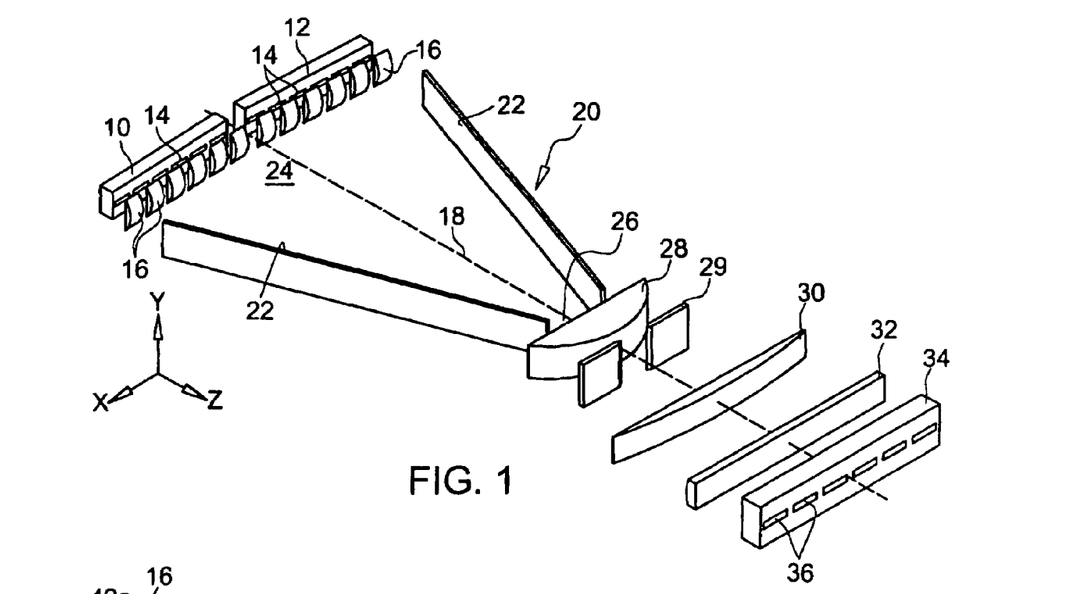
FIG. 1 is a perspective view of an illumination system according to the present invention.

In a preferred embodiment of the present invention shown in FIG. 1, the radiation from two laser arrays 10 and 12 is directed onto a light pipe 20. Light pipe 20 is defined by a pair of reflecting surfaces 22 that are substantially perpendicular to the system plane. The system plane is defined as the plane that is parallel to the XZ plane. Light pipe 20 is tapered from it's input end 24 to its output end 26. The output end 26 of the light pipe 20 is the region between the downstream terminuses of the reflecting surfaces 22.

The pair of laser arrays 10 and 12 preferably comprises a pair of laser diode arrays, each of which has a plurality of emitters 14. Emitters 14 are commonly referred to as stripe emitters since they are very narrow in one direction (typically 1am) and elongated in the other direction (typically greater than 80 µm for a multimode laser). Preferably, the elongated sides of the emitter stripes lie in the system plane. In this case, the Y axis is commonly referred to as the "fast axis" since the laser radiation diverges very quickly in that direction, and the X axis is commonly referred to as the "slow axis" since the laser radiation diverges comparatively slowly in that direction (around 8° included angle divergence in the slow axis compared to around 30° included angle divergence for the fast axis) Each emitter 14 in each of the laser arrays 10 and 12 produces an output beam that is single transverse mode in the fast axis and multiple transverse mode in the slow axis. A microlens 16 is positioned in front of each emitter 14 in order to gather the radiation from emitters 14. In this preferred embodiment of the invention, microlenses 16 are sliced from circular aspheric lens using a pair of spaced apart diamond saw blades (as described in commonly assigned U.S. Pat. No. 5,861,992 to Gelbart).

The output end 26 of light pipe 20 is optically coupled by lenses 28, 30 and 32 onto a light valve 34, thereby allowing the output end 26 to be imaged onto light valve 34. Light valve 34 has a plurality of modulator sites 36. An aperture stop 29 is placed between lenses 28 and 30. The modulator sites 36 of light valve 34 may be imaged onto an intended target using an optical imaging system (not shown).

As shown in FIG. 1, the laser arrays 10 and 12 are preferably "toed-in" slightly to towards central axis 18. Alternatively, the toe-in can be accomplished optically using a cylindrical lens (not shown) having power in the system plane. The cylindrical lens would be preferably located between the Microlenses 16 and the light pipe input end 24.

Figure 2:
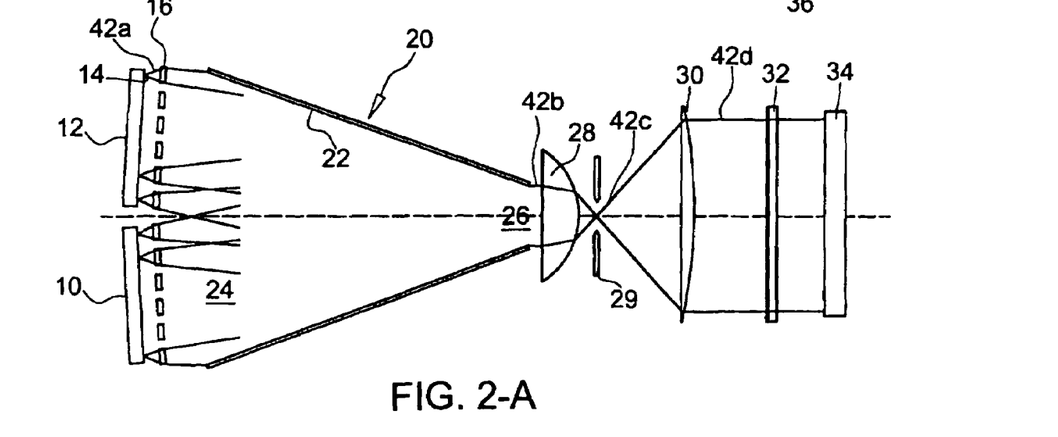

The operation of the illumination system is described in relation to FIG. 1, FIG. 2-A and FIG. 2-B. In the preferred embodiment shown, radiation from the emitters 14 on laser arrays 10 and 12 is astigmatic and an anamorphic imaging system is used to illuminate light valve 34. The propagation of radiation in the fast and slow axes should thus be considered separately.

In the system plane, shown in FIG. 2-A, diverging radiation beams 42a from emitters 14 are gathered by microlenses 16 and directed into the input end 24 of light pipe 20. Microlenses 16 are aligned in the slow axis to aim the radiation beam 42a from each emitter 14 towards central axis 18 near the output end 26 of light pipe 20. However, as per all embodiments of the present invention, any specific radiation beam emitted by a corresponding emitter will, at the input end of the light pipe, not overlap in the slow scan direction with all of the other radiation beams emitted by all of the other emitters, regardless of whether the other emitters are part of the same laser array or any other laser array. It is worth noting that radiation from a given emitter 14 may be collected by more than one microlens 16 and directed into the input end 24 of light pipe 20.

In a plane perpendicular to the system plane, shown in FIG. 2-B, the radiation beams 40a from emitters 14 diverge rapidly. It should be noted that each of radiation beams 40a and 42a represent the beams emitted from emitters 14 as observed in different planes. Each microlens 16 gathers the radiation 40a from a single emitter 14 and focuses it to a waist at a point 44. Point 44 is downstream of the output end 26 the light pipe 20 and is between lenses 28 and 30 in this preferred embodiment of the invention. The location for the waist is chosen to limit the power density on optical surfaces. The waist is imaged on to the light valve 34 by cylindrical lens 32. Alternatively, emitters 14 need not be focused to produce a waist before cylindrical lens 32 but rather, could produce a virtual waist after cylindrical lens 32. Cylindrical lens 32 then images the virtual waist onto the light valve 34.

Returning to the embodiment shown in FIG. 1, microlenses 16 are aligned in the fast axis to locate the waist for each emitter 14 at point 44 in order to overlap the radiation contributions from each emitter 14 thus forming a composite waist at 44.

Optical element 28 is a cylindrical lens having no optical power in the fast axis. Aperture 29 similarly has no effect on the fast axis propagation of the radiation. Element 30 is a spherical field lens. Element 32 is a cylindrical lens with optical power in the fast axis for focusing beams 40c into a narrow line 46 on light valve 34.

Figure 3:
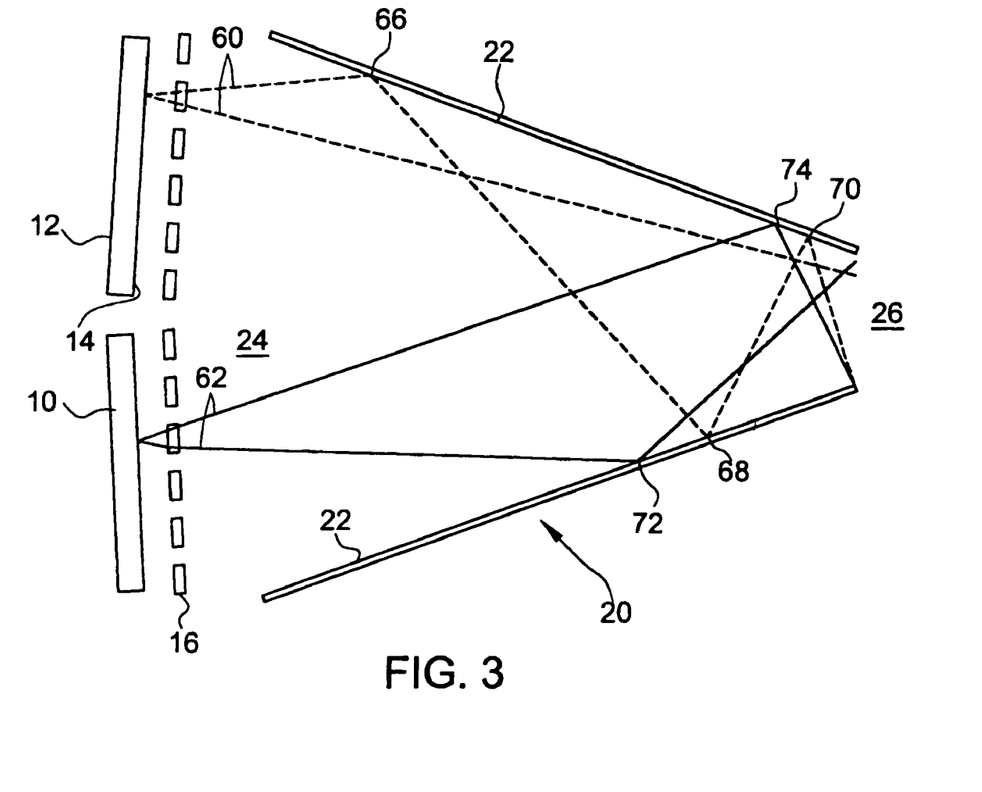
FIG. 3 is a plan view of a light pipe.

Light pipe 20 is used to combine and mix the radiation beams from emitters 14 on laser arrays 10 and 12 and produce an output radiation at the output end 26. The operation of the light pipe 20 is described in relation to FIG. 3. Emitters 14 produce radiation beams that are gathered and focused by microlenses 16 as previously described. Two representative beams 60 and 62 are shown in FIG. 3 although it should be understood that each emitter produces such a beam. Each of beams 60 and 62 should also be understood to include a bundle of rays within the bounds shown for the beam. It should also be further understood that the bounds represented by beams 60 and 62 are shown for the purposes of illustration only and may vary in other preferred embodiments of the invention. Beam 60 is reflected at points 66, 68 and 70 by reflective surfaces 22 before reaching the output end 26 of light pipe 20. Beam 62 is reflected at points 72 and 74 before reaching output end 26. At output end 26, beams 60 and 62 are overlapped and mixed to form part of an output radiation at output end 26. Beams from other emitters 14 will be similarly reflected before reaching output end 26. Thus, at output end 26 the output radiation will comprise an output composite radiation beam made up of a substantial portion (i.e. accounting for any minor losses in the light pipe 20) of each of the radiation beams emitted from emitters 14. Further, at the output end 26, the output radiation comprises a uniform composite illumination line extending from the terminus of one reflecting surface 22 to the terminus of the other reflecting surface 22. This composite illumination line can be magnified by a suitable optical system to illuminate a light valve. It should be noted that at the output end 26, the plurality of radiation beams emitted from laser array 10 will produce a first illumination line and the plurality of radiation beams emitted from laser array 12 will produce a second illumination line. The first and second illumination lines may be spaced apart or at least partially overlapped at output end 26, but in either case they will form the composite illumination line. When spaced apart, the first and second illumination lines can be merged further downstream of the light pipe 20.

Returning now to FIG. 2-A and 2-B, the output end 26 of light pipe 20 is imaged by a cylindrical lens 28 and spherical lens 30 onto light valve 34. Output radiation beams 42b leaving the output end 26 of light pipe 20 are essentially telecentric and an aperture 29 is placed at the focus of lens 28. The function of the aperture 29 is to block outermost rays that may have undergone too many reflections in the light pipe, and consequently have too great an angle to axis 18 upon leaving output end 26. Such rays, if included may reduce the uniformity of composite illumination beam 42c, particularly at the edges. Spherical lens 30 is a field lens, which ensures that beams 42d illuminate light valve 34 telecentrically in the system plane. Telecentric illumination of a light valve ensures that each modulator site is equivalently illuminated.

In summary, the use of light pipe 20 scrambles the radiation beams from the plurality of emitters 14 by the multiple reflections from reflective surfaces 22. The scrambling results in a uniform irradiance profile at output end 26. The output end 26 of the light pipe 20 may be imaged onto a light valve 34 to provide uniform telecentric illumination of the plurality of modulator sites 36.

Advantageously, the reflective surfaces 22 of light pipe 20 may be selected for high reflectivity only for radiation polarized in the direction of the fast axis. Radiation that is polarized in other directions will be attenuated through the multiple reflections in light pipe 20. This is an advantage for some light valves that are only able to modulate beams that are polarized in a specific direction since beams having other polarization directions will be passed through the light valve un-attenuated thus reducing the achievable contrast.

Figure 4:
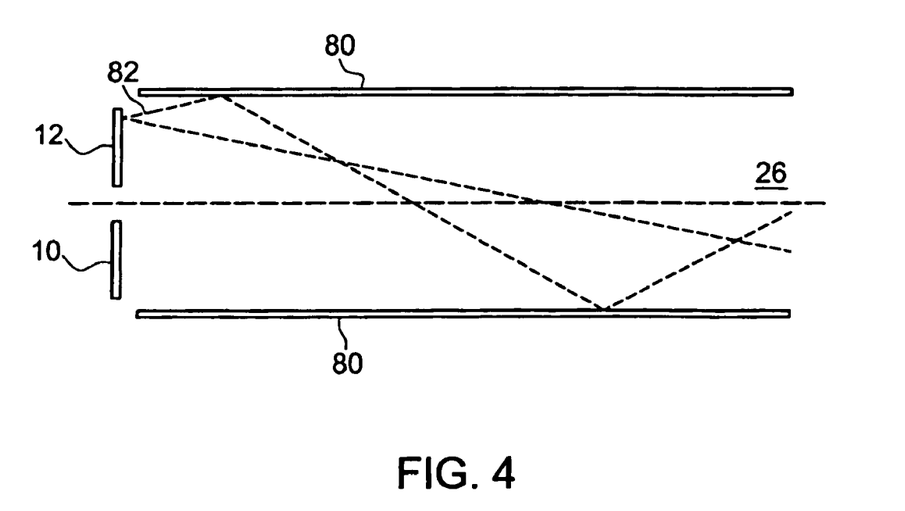
FIG. 4 is a plan view of another embodiment of a light pipe;.
Figure 6:
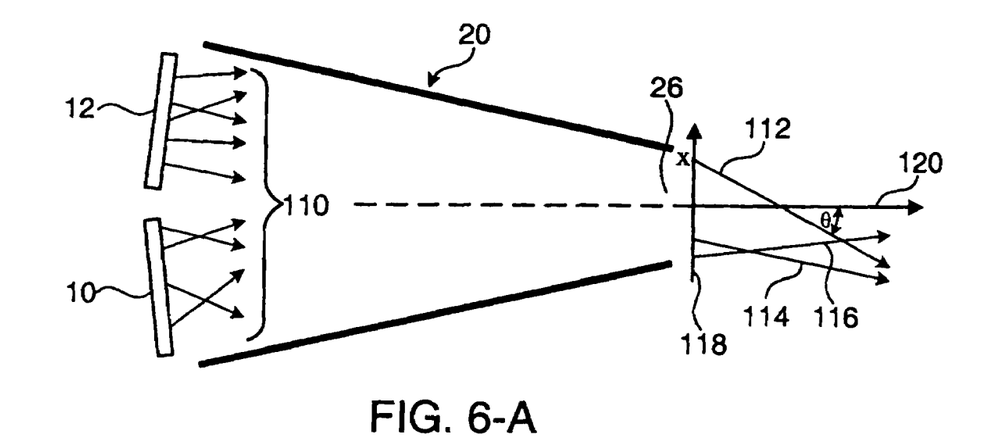

While the light pipe 20 in the preceding embodiment is tapered, this is not mandated. The taper is chosen to suit the a number of factors including the slow axis divergence of the laser emitters, the size of laser arrays 10 and 12, the angle at which the laser arrays are toed in towards axis 18 and any constraints on the length of the light pipe. In some circumstances a non-tapered light pipe may be employed if the emitters are highly divergent and/or if there is sufficient space to allow a longer light pipe. The reflections for any specific light pipe may be examined in the system plane to predict the number of reflections for any given beam and the resultant uniformity of the output (see for example FIG. 6-A and FIG. 6-B). From a modeling of the phase space, the light pipe length and taper may be optimally chosen for a given situation. In an alternative embodiment shown in FIG. 4 a pair of un-microlensed laser arrays 10 and 12 are coupled into a light pipe comprising a pair of parallel reflecting sides 80. A radiation beam 82 from an outer emitter is shown. Some of the rays in beam 82 may undergo two reflections before reaching the output end 26 providing some mixing of the emitter contributions at output end 26.

In an alternative embodiment of the invention, the radiation from all of the emitters of each laser array is collimated in the fast axis direction using a cylindrical lens immediately following the laser arrays.

In many applications it is important to control the pointing direction of the radiation beams emitted from the laser arrays. Where beams are to be combined from two or more lasers arrays, any variation in pointing direction will result in fluctuations in the brightness of the line illumination (brightness is the luminous flux emitted from a surface per unit solid angle per unit of area and is an important parameter in illumination systems). In some applications this will necessitate individually controlling the pointing of each emitter.

One method to actively control the pointing of a laser beam is to use a moveable a reflective element in the laser path to align the beam with a target located some distance away from the laser source. The target is commonly a position sensitive detector (PSD) of some type. The output from the target is used as a feedback signal to servo the moveable reflective element. Alternatively the laser itself may be moveable, removing the need for an additional reflective element.

The extension of this concept to a system of two or more lasers has one quite serious complication, especially when each of the two or more lasers comprises a laser array. In combining radiation from multiple laser arrays using a light pipe, the emphasis is to produce a composite illumination line in which it is not possible to discern individual contributions from the different laser arrays. When a plurality of laser diode arrays is used, this presents an immediate problem for sensing the location of the beams from a particular laser diode. While prior art single laser pointing control schemes may be quite simply adapted to dual laser systems by monitoring the beam extremities before the beams completely overlap, it is not as simple to independently extract positional information at the light pipe output.

Figure 5:
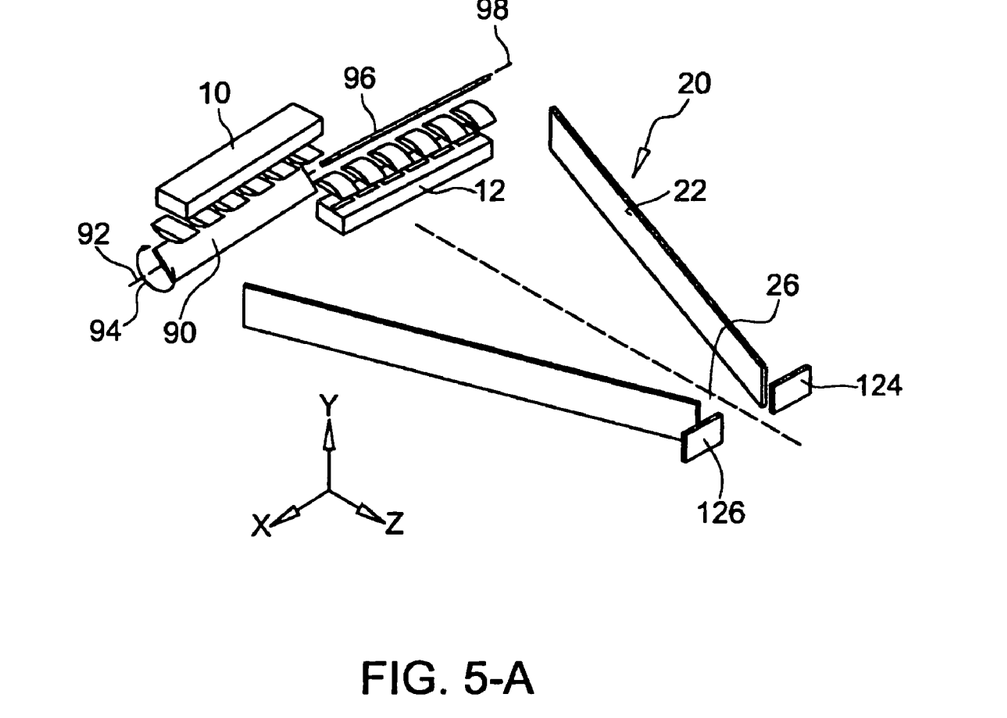

In FIG. 5-A a pair of lasers 10 and 12 are coupled into a light pipe 20. The radiation from laser 10 is directed downwards onto turning mirror 90, which directs the radiation into light pipe 20. Turning mirror 90 is rotatable about axis 92 as indicated by arrow 94. Similarly, the radiation from laser 12, directed upwards onto turning mirror 96, is also directed into the light pipe. Turning mirror 96 is rotatable about axis 98. It should be readily apparent that by rotating each of the mirrors 90 and 96, the pointing direction of lasers 10 and 12 can be changed, and consequently, the location of the radiation beams at the output end 26 of light pipe 20 may be adjusted in the Y axis direction.

FIG. 6-B is a phase space plot of the output end of the light pipe configuration shown in FIG. 6-A. Modeling the laser sources and light pipe reflective surfaces in a mathematical ray tracing simulation produces the plot. In FIG. 6-A, a bundle of rays 110 from lasers 10 and 12 are analyzed with respect to their path through light pipe 20. Three representative rays, 112, 114 and 116 are shown at output end 26. Each ray has a position, x on axis 118 and makes an angle θ with axis 120. The position and angle of each ray exiting light pipe 20 at output end 26 is plotted in FIG. 6-A (as a sine of the angle θ). While only 3 output rays are shown, it should be understood that the phase space plot is produced by observing the x and θ values for a multiplicity of rays and plotting these in FIG. 6-A to form regions of density 122. As an example, rays 112, 114 and 116 are plotted as indicated in FIG. 6-B.

The phase space plot (FIG. 6-B) shows how the illuminated part of the output phase space is made up of contributions from different laser sources. The labels alongside the plot are used to indicate which laser has produced a particular portion of the illumination and how many reflections at surfaces 22 were undergone before arriving at the output end 26. Some rays have too great an angle (at the positive and negative extremes of the sinθ axis) and would compromise the uniformity of the output end 26 of light pipe 20. Illumination contributions outside the extent labeled as "R" on the left hand side of the plot are thus blocked by an aperture to prevent them entering the illumination profile. The blocked region generally represents contributions that have undergone too many reflections (in this case more than two reflections).

Illumination contributions outside region R are clearly identifiable as being from either laser 10 or laser 12. Furthermore, since this part of the illumination line will be blocked anyway, it may be used to monitor the pointing of lasers 10 and 12 without affecting the useful output radiation. In FIG. 5-A, a pair of position sensitive detectors 124 and 126 is located as shown in order to monitor the position of lasers 10 and 12 and provide feedback to a control system.

A suitable controller is schematically depicted in FIG. 5-B. The "set point" is a desired position for the beam. The turning mirror actuator 130 responds to a change in set point by actuating the turning mirror, resulting in a change in physical beam position 132. This change in beam position is detected by PSD sensor 134 and fed back to a comparator 136 (as negative feedback). If the beam position 132 is at the desired location, then feedback 138 and the set point will have the same level and the output 140 of comparator 136 will be zero, meaning that there is no further change in the position of turning mirror actuator 130. If however the feedback 138 deviates from the set point (indicative of a position that deviates from the set point), then the output 140 of comparator 136 acts to correct this deviation. In a two-laser system the controller of FIG. 5-B is duplicated for each laser and each laser is individually controlled. Conveniently, the laser beams may be adjusted for optimal overlap in the Y axis by adjusting the set point to each of the control loops.

Figure 7:
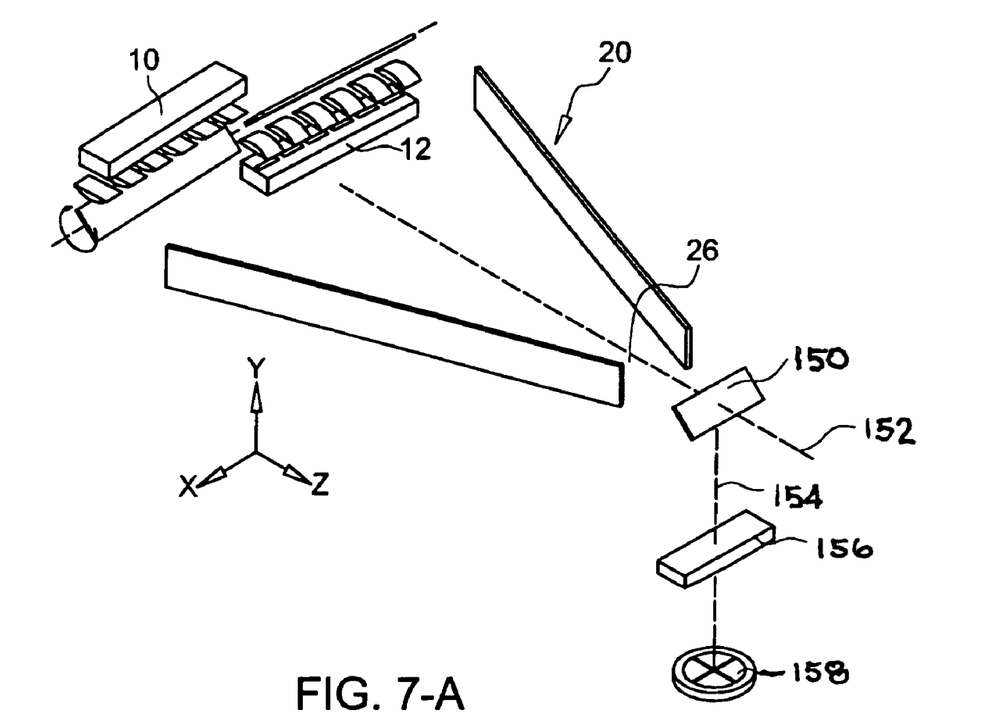

In an alternative embodiment shown in FIG. 7-A the output end 26 from light pipe 20 may be directed to a beamsplitter 150 located downstream of the light pipe 20. Beamsplitter 150 separates the light output into two beams. The bulk of the energy is allowed to pass through beamsplitter 150 as beam 152, which illuminates the light valve (not shown). A smaller portion is split off as beam 154, passes through lens 156, and is directed to a quadrant detector 158. The lens 156 and the positioning of quadrant detector 158 are selected to image the laser arrays 10 and 12 onto detector 158.

Referring to FIG. 6-B, the central region of the plot has contributions from laser 10 above the x axis and laser 12 below the x axis. Returning now to FIG. 7-B, these contributions are shown on quadrant detector 158 as beam 160, corresponding to the contribution from laser 10, and beam 165 corresponding to the contribution from laser 12. The lens 156 and detector 158 are aligned so that beam 160 falls on detector segments 170 and 172 and beam 165 falls on detector segments 174 and 176. Changes in pointing will move beams 160 and 165 up and down changing the signals level detected at the various segments. Beam 160 is vertically centered over segments 170 and 172 and hence the signal output from each of these detectors will be the same. Beam 165 illuminates more of segment 174 than 176 and hence the signals from these segments will not be the same. By changing the pointing of laser 10 until the signal levels on segments 174 and 176 are the same, beam 165 can be centered and aligned with beam 160. In this manner the beam pointing may be actively controlled. It should be readily apparent however that it is not necessary that the beams be centered over the detector segments. In practice both beams may be offset by some amount as needed. The offsets need not even be identical since the beam pointing may be adjusted to an external diagnostic system and the beams 160 and 165 may have different offset targets according to which they are controlled.

While the quadrant detector provides a convenient format for controlling two beams on a single element, it may be replaced by a pair of position sensitive detectors, wherein one of the detectors is employed for each beam.

In the embodiments described herein, the radiation is formed into a narrow line at the light valve but this is not mandated. In general the radiation line is formatted to suit the light valve and the radiation may be spread over a wider area. Additionally while embodiments described herein show the lasers emitting in a common plane, the lasers could also be disposed to emit in a different plane. In this case the light pipe still mixes the beams in the slow axis direction, the combination of the beams in the fast axis occurring after the light pipe. It is to be noted that preferred embodiments of the invention may employ two or more lasers, wherein each of the lasers is an individual laser beam. Alternatively, each of the two or more lasers may each comprise a laser array made up of a plurality of laser elements. Further, alternative embodiments of the invention may incorporate a single laser array comprising a plurality of lasers. Accordingly, laser arrays that are laser diode arrays will be made up of a plurality of laser diodes. In the preferred embodiments of the invention in which laser diode arrays are employed, a microlens is preferably positioned in front of each emitter in the diode arrays. Other microlens elements may also be used such as the monolithic micro-optical arrays produced by Lissotschenko Mikrooptik (LIMO) GmbH of Dortmund, Germany. LIMO produces a range of fast axis and slow axis collimators that may be used alone or in combination to format the radiation from laser diode arrays.

Laser arrays other than laser diode arrays may also be employed as a source. For example the arrays may be formed using a plurality of fiber coupled laser diodes with the fiber tips held in spaced apart relation to each other, thus forming an array of laser beams. The output of such fibers may likewise be coupled into a light pipe and scrambled to produce a homogeneous illumination line. In another alternative the fibers could also be a plurality of fiber lasers with outputs arrayed in fixed relation. Preferred embodiments of the invention employ infrared lasers. Infrared diode laser arrays employing 150 μm emitters with total power output of around 50 W at a wavelength of 830 nm, have been successfully used in the present invention. It will be apparent to practitioners in the art that alternative lasers including visible light lasers are also employable in the present invention.

Conveniently, the light pipe may be produced using a pair of reflective mirrors as described herein, but this is not mandated. The light pipe may also be fabricated from a transparent glass solid that has opposing reflective surfaces for reflecting the laser beams. A suitable solid would have the same shape as the area between the reflective mirrors shown in the drawing figures, (i.e. wedge shaped). The surfaces may be coated with a reflective layer or the light pipe may rely on total internal refraction to channel the laser beams toward the output end of the light pipe.

Finally, the optical path from the output end to the light valve has been shown to lie substantially along the system plane. Alternate embodiments of the invention may employ one or more optical elements such as mirrors between the light pipe and the light valve so as to permit the positioning of the light valve on a plane offset from the system plane or to position the light valve on a plane that is at an angle to the system plane. These alternate positions of the valve, may advantageously allow for a more compact imaging system.

As will be apparent to those skilled in the art in light of the foregoing disclosure, many alterations and modifications are possible in the practice of this invention without departing from the spirit or scope thereof.

What is claimed is:

1. An apparatus for illuminating a light valve, comprising:
   a.) a first laser array capable of emitting a first plurality of radiation beams each propagating along a first axis and a second axis;
   b.) a light pipe comprising:
      i.) two reflecting surfaces, the two reflecting surfaces being spaced apart and opposing each other to reflect light therebetween along the first axis;
      ii.) an input end separation between the two planar reflecting surfaces, said separation being sized so that the first plurality of radiation beams can be received without concentration thereof along the first axis; and
      iii.) an output end separation between the two reflecting surfaces sized for emitting an output radiation;
   c.) at least one optical element located downstream of the output end, operable for illuminating the light valve by imaging the output end separation onto the light valve; and
   d.) each emitted radiation beam being associated with a lens concentrating each radiation beam along the second axis toward a convergence point that is near or downstream of the output end separation without concentration thereof along the first axis to the convergence point;
   wherein the at least one optical element comprises a lens for imaging the output end onto the light valve in a substantially telecentric fashion.

2. An apparatus for illuminating a light valve, comprising:
   a.) a first laser array capable of emitting a first plurality of radiation beams each propagating along a first axis and second axis;
   b.) a second laser array capable of emitting a second plurality of radiation beams;
   c.) a light pipe comprising:
      i.) two reflecting surfaces, the two reflecting surfaces being spaced apart and opposing each other to reflect light therebetween along the first axis;
      ii.) an input end separation between the two planar reflecting surfaces, said separation being sized so that the first plurality of radiation beams can be received without concentration thereof along the first axis at the input end separation; and
      iii.) an output end separation between the two reflecting surfaces sized for emitting an output radiation said output end separation being smaller than said input end separation so that the light entering the input end separation by reflection is between the two planar reflecting surfaces;
   d.) at least one optical element located downstream of the output end, operable for illuminating the light valve by imaging at least a portion of the output end separation onto the light valve; and
   e.) each emitted radiation beam being associated with a lens between the laser array and the input end, concentrating each radiation beam along the second axis toward a convergence point that is near to or downstream of the output end separation without concentration thereof along the first axis to the convergence point, wherein the output radiation comprises at least a portion of the first plurality of radiation beams and at least a portion of the second plurality of radiation beams, and wherein the apparatus further comprises:
      i.) at least a first position sensor located downstream of the light pipe, the at least a first position sensor operable for producing a first position feedback signal corresponding to a position of the at least a portion of the first plurality of radiation beams; and
      ii.) at least a first actuator operable for changing a pointing direction of at the first laser array in response to the first position feedback signal;
      iii.) at least a second position sensor located downstream of the light pipe, the at least a second position sensor operable for producing a second position feedback signal corresponding to a position of the at least a portion of the second plurality of radiation beams; and
      iv.) at least a second actuator operable for changing a pointing direction of the second laser array in response to the second position feedback signal;
   wherein the at least a first actuator changes a position of a first optical element in a path of the first plurality of radiation beams; and the at least a second actuator changes a position of a second optical element in a path of the second plurality of radiation beams and wherein each of the first optical element and the second optical element is a turning mirror.

3. A method for illuminating a light valve, the method comprising:
   a.) emitting a first plurality of radiation beams from a first laser array toward a light pipe comprising an input end, and output end and a pair of opposing planar reflecting surfaces spaced apart along a first axis;

b.) concentrating the radiation beams along a second axis toward a convergence point that is near or after the output end;
c.) combining the radiation beams by reflection only between the two reflecting surfaces to produce a combined output radiation at the output end; and
d.) illuminating the light valve by imaging the radiation from the output end separation onto the light valve,
e.) emitting a second plurality of radiation beams from at least a second laser array toward the input end; and
f.) concentrating the second plurality of radiation beams toward a convergence point that is after the input end wherein the output radiation comprises an first illumination line corresponding to the first array, and a second illumination line corresponding to the at least a second array, the first and second illumination lines being spaced apart and perpendicular to a system plane, the method comprising merging the first and second illumination lines downstream of the output end of the light pipe.

4. An apparatus for illuminating a light valve, comprising:
a first laser array capable of emitting a first plurality of radiation beams said radiation beams propagate along a first axis and a second axis;
a light pipe having two planar reflecting surfaces arranged in opposition along the first axis; said reflecting surfaces having a separation at an input end that is sized and positioned to receive both the concentrated and unconcentrated portions of the radiation beams at the input end between the reflecting surfaces, said reflecting surfaces further being adapted to reflectively direct the received radiation beams to an output end; and
at least one optical element located downstream of the output end, said optical element having a plurality of surfaces and being operable for illuminating the light valve by imaging the output end onto the light valve;
wherein multiple reflections between the reflecting surfaces along the first axis in the light pipe form a composite radiation beam at the output end made up of a substantial portion of each of the radiation beams entering the input end while a lens concentrating the radiation beams toward a concentration point that is beyond the output end of the light pipe limits the power density acting on the surfaces of the at least one optical element.

5. The apparatus of claim 4, wherein said reflective surfaces have high polarization in the direction of the first axis to be highly reflective to radiation that is polarized along the first axis, but that attenuate radiation that is polarized along other axes in other directions.

* * * * *

UNITED STATES PATENT AND TRADEMARK OFFICE
CERTIFICATE OF CORRECTION

PATENT NO. : 7,209,624 B2 Page 1 of 1
APPLICATION NO. : 11/038188
DATED : April 24, 2007
INVENTOR(S) : Olena Dets et al.

It is certified that error appears in the above-identified patent and that said Letters Patent is hereby corrected as shown below:

Col. 10, Ln 4
In Claim 2, before "second" insert --a--.

Col. 10, Ln 18
In Claim 2, delete "radiation" and insert --radiation,--, therefor.

Col. 10, Ln 38
In Claim 2, after "at least" delete "a".

Col. 10, Ln 43
In Claim 2, after "of" delete "at".

Col. 11, Ln 13
In Claim 3, delete "an" and insert --a--, therefor.

Signed and Sealed this

Sixth Day of May, 2008

JON W. DUDAS
*Director of the United States Patent and Trademark Office*